(12) United States Patent
Bhushan et al.

(10) Patent No.: US 6,559,680 B2
(45) Date of Patent: *May 6, 2003

(54) DATA DRIVEN KEEPER FOR A DOMINO CIRCUIT

(75) Inventors: Bharat Bhushan, Cupertino, CA (US); Vivek Joshi, Sunnyvale, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/448,250

(22) Filed: Nov. 24, 1999

(65) Prior Publication Data

US 2001/0052797 A1 Dec. 20, 2001

(51) Int. Cl.⁷ .............................................. H03K 19/096
(52) U.S. Cl. .......................................... 326/95; 326/83
(58) Field of Search ............................. 326/95, 98, 83

(56) References Cited

U.S. PATENT DOCUMENTS

| 3,551,693 | A | * | 12/1970 | Burns et al. ................. 307/205 |
| 5,223,834 | A | * | 6/1993 | Wang et al. ................. 341/136 |
| 5,612,638 | A | * | 3/1997 | Lev ............................. 326/98 |
| 5,852,373 | A | * | 12/1998 | Chu et al. ..................... 326/98 |
| 6,002,292 | A | * | 12/1999 | Allen et al. .................. 327/379 |
| 6,025,739 | A | * | 2/2000 | Campbell et al. ............. 326/83 |
| 6,043,674 | A | * | 3/2000 | Sobelman .................... 326/35 |
| 6,052,008 | A | * | 4/2000 | Chu et al. ................... 327/200 |
| 6,204,696 | B1 | * | 3/2001 | Krishnamurthy et al. ..... 326/98 |

* cited by examiner

*Primary Examiner*—Daniel Chang
(74) *Attorney, Agent, or Firm*—Trop, Pruner & Hu, P.C.

(57) ABSTRACT

A domino circuit may be provided with additional keeper transistors that are selectively activated when one of the input transistors in a logic structure has a low or inactive signal applied to it during the evaluation stage. Thus, the potential of the output node of the domino circuit may be maintained, improving the soft error rate.

32 Claims, 2 Drawing Sheets

DATA DRIVEN KEEPER FOR A DOMINO CIRCUIT

BACKGROUND

This invention relates generally to domino circuits.

A static CMOS gate is a fully complementary logic gate with P and N-channel (i.e., p-channel and n-channel metal oxide semiconductor) devices configured to implement a desired logic function. A dynamic complementary metal oxide semiconductor (CMOS) gate includes an N-channel device logic structure having a pre-charge or output node precharged to the supply voltage with a single clocked P-channel device. The output node is conditionally discharged (evaluated) by a set of devices forming the logic structure, coupled to external ground.

The clocked P-channel device has its gate coupled to an input clock signal. When the input clock signal is active, the output node is "precharged" through a P-channel device to the supply voltage. When the clock input is inactive, the output node is conditionally discharged (evaluated) through the set of devices forming the logic structure, to external ground. The logic structure may implement a logic function such as a NAND or a NOR logic function as examples.

Dynamic or domino logic circuits are dynamic because operation of the circuit is controlled dynamically by an input clock signal. Domino logic units are typically arranged in a plurality of domino stages, each stage having logic cells, such as NAND gates or NOR gates as examples, with each stage separated by an inverting stage. In this arrangement, an input signal applied to the first stage while the clock signal is active, triggers operation of the remaining stages in sequence. This yields a domino-like signal propagation effect within the logic unit.

During the evaluation phase, the inputs to the set of devices forming the logic structure only change from nonactive to an active state. Otherwise, the output node may be corrupted without P-channel devices to pull the output node back up. Inverting stages are provided between each logic stage to facilitate proper precharging or evaluating of the individual domino circuits active during the precharge phase.

Referring to FIG. 4, a single stage NAND gate domino circuit 10 includes a single P-channel device 12a in combination with a set of N-channel devices 14 forming a logic structure. A keeper 16 may include an inverter and a P-channel transistor. The keeper offsets any charge leakage that might occur at the output node when the N-channel devices 14 of the logic structure are inactive. A domino NAND gate may be referred to as a "clocked" domino gate because the input clock signal is connected to an N-channel device 12b in series with the N-channel devices of the logic structure. The single N-channel device 12b connected to the clock signal selectively blocks a power dissipation path between the external power supply and external ground during the precharge phase.

In use, dynamic or domino logic circuits operate in phases including a precharge phase and an evaluate phase. During the precharge phase, the transistors of the logic structure of the domino circuit are precharged. During the evaluate phase, input signals may be applied to the gates of each of the transistors of the logic structure and the clock signal is active.

As feature size and external power supplies are scaled as a result of advances in CMOS process technology, a significant decrease in the charge at the input and output nodes of domino circuits may result. This decrease in node charge may lead to an increase in soft error rates (SER) caused by cosmic radiation and packaging materials.

During an SER event, domino circuits may generate errors while holding a high or active level at the precharge node. Noise immunity may be improved by adding a P-channel keeper. Although the robustness of a domino gate against soft errors may be enhanced by increasing the size of the keeper, this eventually leads to performance degradation. This may be due in part because contention may arise between the keeper and the N-channel devices of the logic structure. This degradation may be significant, in large fan-in domino topologies for example, as the effective width of the N-channel devices of the structure is small.

Thus, there is a continuing need for better ways to decrease the soft error rates of domino circuits.

SUMMARY

In accordance with one aspect, a domino circuit includes an output node and an input transistor coupled to the output node. A charge source is coupled to the node and the transistor to selectively charge the node depending on the signal applied to the transistor.

Other aspects are set forth in the accompanying detailed description and claims.

DETAILED DESCRIPTION

Figure 1:
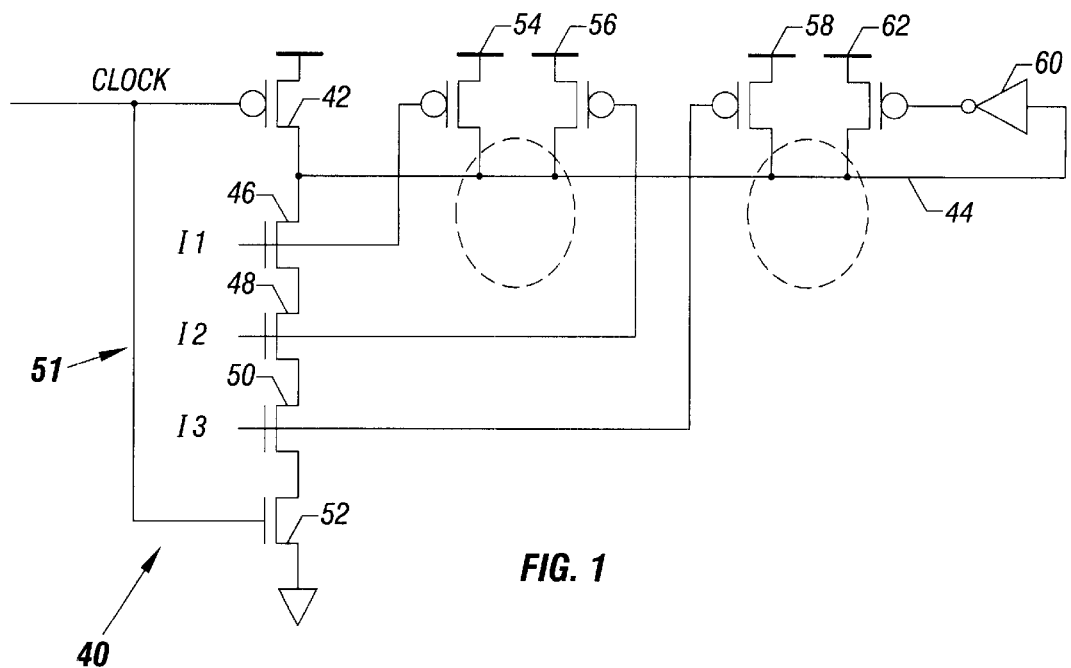
FIG. 1 is a schematic depiction of one embodiment of the present invention.

Referring to FIG. 1, a domino circuit 40 includes a P-channel transistor 42 having its source coupled to an external power supply potential. The drain of the transistor 42 is coupled to the output node 44. A set of three N-channel input transistors 46, 48 and 50 form a logic structure 51. The devices 46, 48 and 50 are illustrated as being coupled to the drain of the P-channel device 42. In one embodiment of the present invention, the logic structure 51 is a NAND gate formed of N-channel transistors. An additional N-channel transistor 52 has its source coupled to external ground and its gate connected to a clock signal that also drives the gate of the P-channel transistor 42. The drain of the transistor 52 is coupled to the logic structure 51, and in the illustrated embodiment, the source of the input transistor 50.

While a logic structure 51 that is a NAND gate having three input transistors is illustrated, a variety of other logic structures may be implemented using the principles set forth in the present invention. Another logic structure normally implemented with domino circuits is NOR gate as an example.

When the clock signal (CLOCK) is active or low, the output node 44 is charged up and is prevented from being discharged because the transistor 52 is not conducting. This condition generally corresponds to the precharge state of the domino circuit 40.

Each input transistor 46, 48 and 50 has its gate coupled to receive an input signal indicated as I1, I2 or I3. Each input signal is also coupled to a P-channel transistor 54, 56 or 58, each arranged to act as a keeper device. Each P-channel transistor 54, 56 and 58 has its drain coupled to the output node 44 and its source coupled to the external supply voltage. In one embodiment of the present invention, the drains of adjacent pairs of P-channel transistors, such as the transistors 54 and 56, may share drain diffusions as indicated in dashed ovals in FIG. 1.

Also coupled to the output node 44 is an inverter 60 and a P-channel transistor 62 that form a keeper circuit. Like the transistors 54, 56 and 58, the transistor 62 is also coupled between the external supply voltage and the output node 44.

As an example, where the input transistors 46, 48 and 50 are eight microns in width, and the transistor 52 is also eight microns in width, the effective width of the combined transistors is two microns. In this case, the transistors 54 to 62 may be relatively smaller devices, each have a width of about one micron for example. However, as can been seen in FIG. 2, due to the use of a plurality of transistors 54, 56, 58 and 62, the node 44 charge sustaining ability may be increased.

When all of the input signals I1, I2 and I3 are high, the transistors 54, 56, and 58 are all shut off and thus the transistors 54, 56 and 58 do not deteriorate the delay. However, when one or more of the input signals I1, I2 or I3 is inactive or low, the domino circuit 40 does not evaluate and one or more of the P-channel transistors 54, 56 and 58 is enabled or active. Thus, the transistor 54, 56 or 58 coupled to an inactive input signal tends to sustain the potential on the output node 44. For example, if I2 is inactive or low, P-channel transistor 56 may be active. By sustaining the potential on the output node 44, the soft error rate may be improved.

In some embodiments of the present invention, the effective keeper strength (which is a result of the transistors 54, 56, 58 and 62) may be increased two to four times compared to the design shown in FIG. 1. This domino technology may be used effectively in address decoders and particularly in situations where domino circuits are driven directly from latches.

Thus, in the circuit 40, the transistors 54, 56 and 58 act as data driven keepers. That is, they selectively sustain the potential on the node 44 depending on the state of the input signals I1, I2 and I3. Where the input signal to a given transistor in the logic structure 51 is low, a keeper transistor 54, 56 or 58 coupled to that transistor's gate may actively supply charge to the node 44.

While the present invention is illustrated as using n-channel transistors in the logic structure, n-channel transistors may be used in place of p-channel transistors and vice versa.

Figure 2:
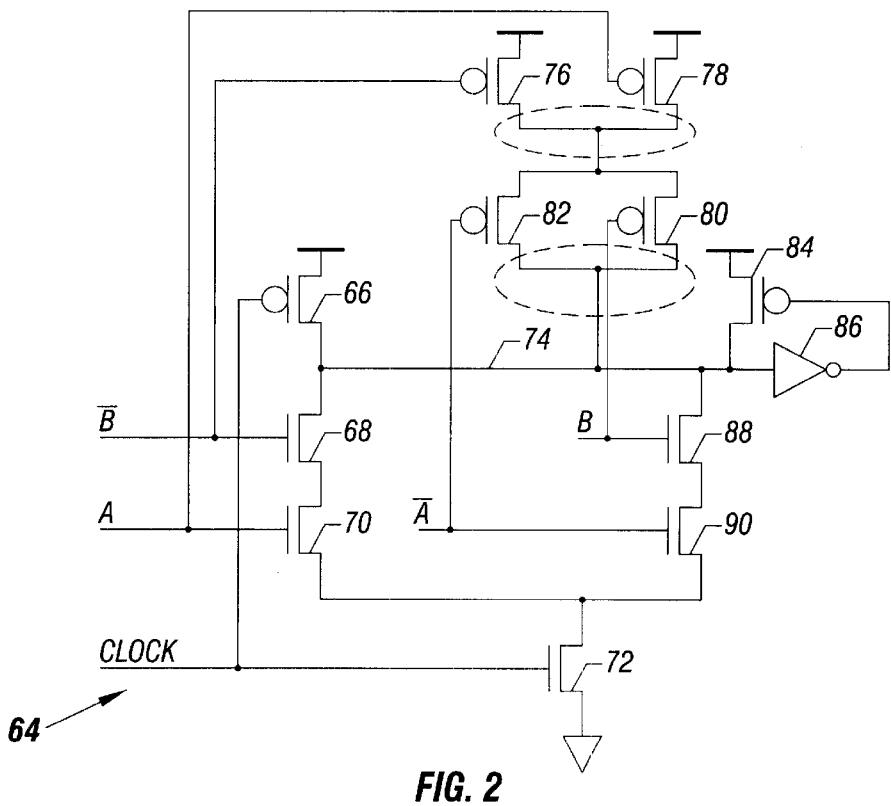
FIG. 2 is a schematic depiction of another embodiment of the present invention.

The principles described in connection with a NAND gate domino circuit can also be applied to an exclusive OR (XOR) domino circuit 64 as shown in FIG. 2. In this case, a p-channel transistor 66 is coupled to an output node 74. A transistor 68 is also coupled to the output node 74 and has the signal $\overline{B}$ coupled to its gate. Another transistor 70 has an input signal A coupled to its gate. A clock signal is coupled to the gate of the p-channel transistor 66 and an n-channel transistor 72 which is also coupled to ground. A second pair of transistors 88 and 90 have the input signals B and $\overline{A}$ coupled to their gates. Each of the transistors 68, 70, 80 and 90 also have their gates coupled to a p-channel transistor 76, 78, 88 or 82 as illustrated. The drains of the transistors may share diffusions as indicated in dashed lines. A keeper transistor 84 has its gate coupled to an inverter 86 as described previously.

In this case, the transistors 76, 78, 80 and 82 act as data driven keepers. That is, they selectively sustain a potential on the node 74 depending on the state of the input signals A, B, $\overline{B}$ and $\overline{A}$. Where the input signal to a given transistor in the logic structure is low, a keeper transistor 76, 78, 80 or 82 coupled to that transistors gate may actively supply charge to the node 74.

Figure 3:
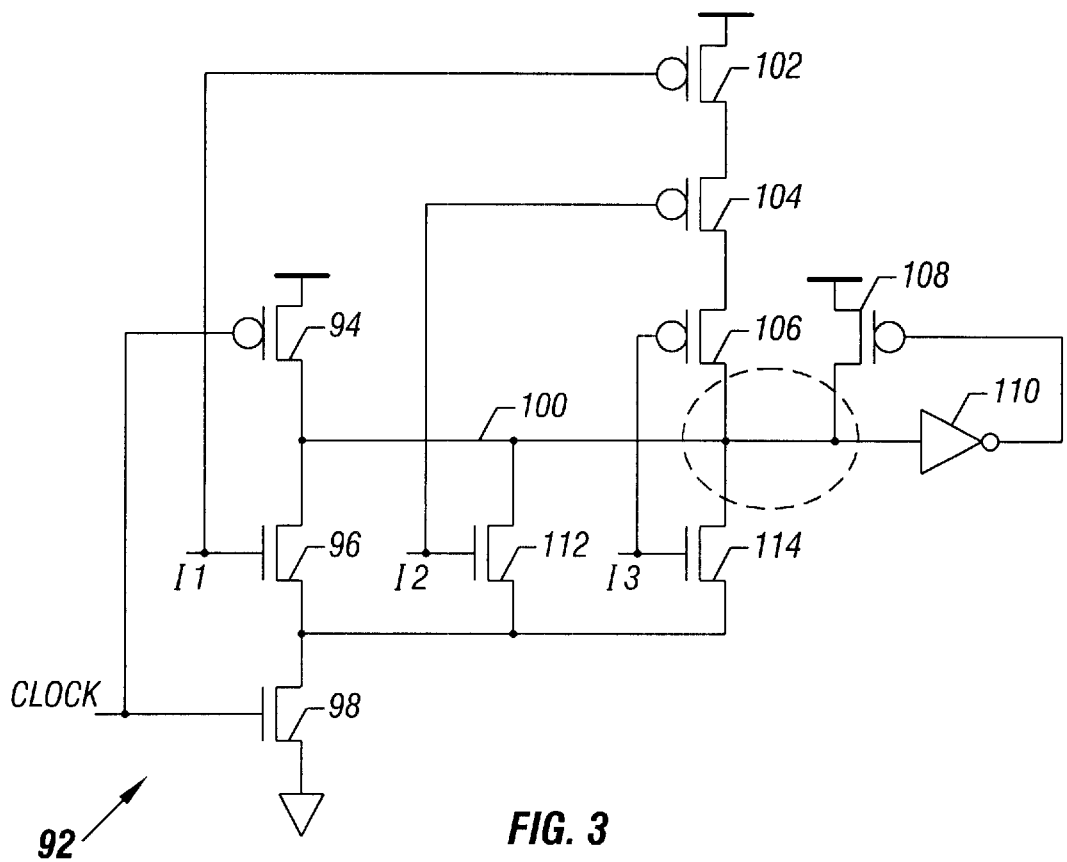
FIG. 3 is a schematic depiction of another embodiment of the present invention.
Figure 4:
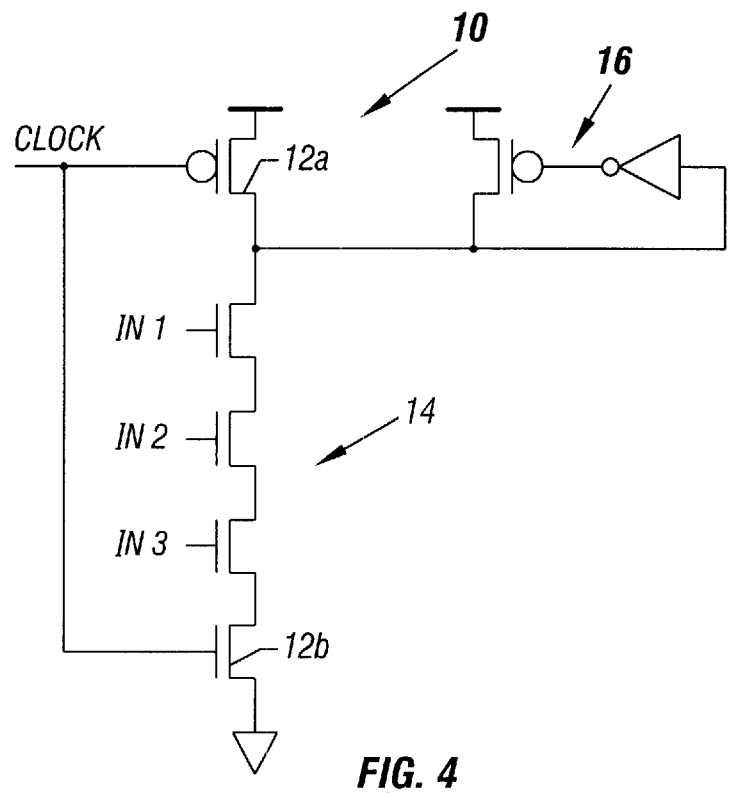
FIG. 4 is a depiction of a corresponding structure in accordance with the prior art.

Referring next to FIG. 3, an embodiment of the present invention in connection with a NOR domino gate 92 receives the input signals I1, I2 and I3 on the gates of transistors 96, 112 and 114. These gates are also coupled to keeper p-channel transistors 102, 104 and 106. In this case, the p-channel transistors 102, 104 and 106 are connected in series between a supply voltage and an output node 100. Also coupled to an output node 100, is an inverter 110 and a keeper p-channel transistor 108. A clock input signal in connected to the gate of a p-channel transistor 94 and an n-channel transistor 98. Again, the p-channel keeper transistors 102, 104 and 106 maintain the potential on the output node 100 when an input signal to a given transistor 96, 112 or 114 is low by actively supplying charge to the node 100.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A domino circuit comprising:
   an output node;
   a keeper circuit coupled to said output node;
   a plurality of input transistors; and
   a plurality of keeper transistors being coupled to the plurality of input transistors to form a complementary structure in which a different one of said plurality of input transistors is gate-coupled to a corresponding one of said plurality of keeper transistors to selectively charge said output node depending on the signal applied to each input transistor, wherein the corresponding one of said plurality of keeper transistors is activated to charge said output node in response to the different one of said plurality of input transistors receiving a low logic input signal while the keeper circuit to offset an associated charge variation in a precharged output at said output node.

2. The circuit of claim 1 wherein said plurality of input transistors forming a logic structure.

3. The circuit of claim 2 wherein said logic structure is a NAND gate.

4. The circuit of claim 1 wherein said input transistors are N-channel transistors and said keeper transistors are P-channel transistors.

5. The circuit of claim 4 wherein said input transistors are wider than said keeper transistors.

6. The circuit of claim 1 wherein at least one pair of keeper transistors having a common drain diffusion.

7. The circuit of claim 6 wherein said keeper transistors are P-channel transistors having their sources coupled to a supply potential and their drains coupled to said output node.

8. The circuit of claim 1 including a P-channel transistor having its gate coupled to a clock signal and its drain coupled to said output node, the source of said P-channel transistor coupled to a supply voltage, said domino circuit including an N-channel transistor having its drain coupled to said input transistor and a source coupled to external ground, the gate of said N-channel transistor being coupled to said clock signal.

9. A method of operating a domino circuit comprising:
detecting each signal applied to the gates of a plurality of input and keeper transistors forming a complementary structure in said domino circuit in which a different one of said plurality of input transistors is gate-coupled to a corresponding one of said plurality of keeper transistors; and
in response to a low signal applied to any of said gates of said plurality of input transistors in an evaluation phase, supplying an additional charge to the output node of said domino circuit to supplement a charge provided by a keeper circuit that substantially maintains a precharged output of a precharge phase at the output node.

10. The method of claim 9 including causing a keeper transistor to conduct when the signal to one of said plurality of input transistors is low.

11. The method of claim 10 including forming at least two N-channel input transistors and forming at least two P-channel keeper transistors.

12. The method of claim 11 including using a common drain for said keeper transistors.

13. A domino circuit comprising:
an output node;
a logic structure including a plurality of input and keeper transistors to form one or more complementary pairs of input and keeper transistors, each complementary pair to enable supplying of a charge to said output node in response to receiving an inactive signal; and
a keeper circuit coupled to said output node to provide an additional charge to maintain a precharged output at the output node in response to receiving said inactive signal at any of said one or more complementary pairs of said plurality of input and keeper transistors.

14. The circuit of claim 13 wherein said logic structure is a NAND gate.

15. The circuit of claim 13 at least one pair of keeper circuit having a common drain diffusion.

16. A domino circuit comprising:
an output node;
a first pair of transistors including a first input transistor coupled to a first keeper transistor being complementary with respect to said first input transistor to selectively charge or discharge said output node depending on a first driving signal applied to said first pair of transistors;
a second pair of transistors including a second input transistor coupled to a second keeper transistor being complementary with respect to said second input transistor to selectively charge or discharge said output node depending on a second driving signal applied to said second pair of transistors, wherein said first and second pair of transistors form a complementary logic structure such that a different one of the first and second input transistors is gate-coupled to a corresponding one of the first and second keeper transistors; and
a keeper circuit including an additional keeper transistor and an inverter, said keeper circuit coupled to said output node to offset an associated charge variation at said output node in response to receiving an inactive signal in any one of the fist and second driving signals during an evaluation phase.

17. The circuit of claim 16, wherein said complementary logic structure to define a one-to-one mapping relationship between each of the first and second input transistors and each of the first and second keeper transistors.

18. The circuit of claim 17 wherein said complementary logic structure to enable dynamic charging of said output node in a balanced manner when said first and second signals are in a low logic state and to enable dynamic discharging of said output node in a balanced manner when said first and second signals are in a high logic state.

19. The circuit of claim 16 wherein said first and second input transistors are N-channel transistors and said first and second keeper transistors are P-channel transistors.

20. The circuit of claim 16 wherein said complementary logic structure is a NAND gate.

21. The circuit of claim 20 wherein said first and second input transistors are wider than said first and second keeper transistors.

22. The circuit of claim 20 wherein said first and second keeper transistors share a common drain diffusion.

23. The circuit of claim 20 wherein the sources of said first and second keeper transistors are coupled to a supply potential and the drains are coupled to said output node.

24. The circuit of claim 16 including a P-channel transistor having its gate coupled to a clock signal and its drain coupled to said output node, the source of said P-channel transistor coupled to a supply voltage, said domino circuit including an N-channel transistor having its drain coupled to at least one of said first and second input transistors and a source coupled to external ground, the gate of said N-channel transistor being coupled to said clock signal.

25. A method of op crating a domino circuit comprising:
providing a charge at the output node of said domino circuit to offset any charge leakage;
detecting a signal applied to a gate of an input transistor in a domino circuit complementary logic structure;
in response to said signal, selectively supplying an additional charge to the output node of said domino circuit; and
gate-coupling said input transistor to a keeper transistor in the domino circuit complementary logic structure.

26. The method of claim 25 including causing said keeper transistor to conduct when the signal applied to the gate of said input transistor is low in an evaluation phase for said domino circuit.

27. The method of claim 26 including using a keeper circuit to provide the charge to substantially maintain a precharged output of a precharge phase for said domino circuit while said keeper transistor supplements the charge with said additional charge to reduce soft error rates of said domino circuit.

28. The method of claim 27 including using a common drain for said keeper transistor and said keeper circuit.

29. A domino circuit comprising:
an output node;
a keeper circuit to provide a charge at the output node of said domino circuit to offset any charge leakage; and
a domino circuit complementary logic structure coupled to the output node, said domino circuit complementary logic structure including an input and an keeper transistor, each transistor including a gate to receive a signal, wherein said keeper transistor to selectively supply an additional charge to the output node of said domino circuit depending on the signal applied to the gate of said input transistor and wherein the gate of said input transistor is coupled to the gate of said keeper transistor in said domino circuit complementary logic structure.

30. A The domino circuit of claim 29, wherein in an evaluation phase for said domino circuit said keeper transistor to conduct when the signal applied to the gate of said input transistor is low.

31. The domino circuit of claim 30, wherein said keeper circuit to provide the charge to substantially maintain a precharged output of a precharge phase for said domino circuit while said keeper transistor supplements the charge with said additional charge to reduce soft error rates of said domino circuit.

32. The domino circuit of claim 31, said keeper transistor and said keeper circuit having a common drain diffusion.

* * * * *

UNITED STATES PATENT AND TRADEMARK OFFICE
CERTIFICATE OF CORRECTION

PATENT NO. : 6,559,680 B2
DATED : May 6, 2003
INVENTOR(S) : Bharat Bhushan and Vivek Joshi It is certified that error appears in the above-identified patent and that said Letters Patent is hereby corrected as shown below:

Column 6,
Line 28, "op crating" should be -- operating --.

Signed and Sealed this

Second Day of September, 2003

JAMES E. ROGAN
*Director of the United States Patent and Trademark Office*